US007558028B2

(12) United States Patent
Carey et al.

(10) Patent No.: US 7,558,028 B2
(45) Date of Patent: Jul. 7, 2009

(54) MAGNETIC HEAD WITH IMPROVED CPP SENSOR USING HEUSLER ALLOYS

(75) Inventors: Matthew Joseph Carey, San Jose, CA (US); Jeffrey Robinson Childress, San Jose, CA (US); Stefan Maat, San Jose, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 463 days.

(21) Appl. No.: 11/281,054

(22) Filed: Nov. 16, 2005

(65) Prior Publication Data

US 2007/0109693 A1    May 17, 2007

(51) Int. Cl.
*G11B 5/127*    (2006.01)
(52) U.S. Cl. .................................. 360/324.12
(58) Field of Classification Search ........................ None
See application file for complete search history.

(56) References Cited

U.S. PATENT DOCUMENTS

| | | | |
|---|---|---|---|
| 5,365,212 A | 11/1994 | Saito et al. | |
| 5,549,978 A | 8/1996 | Iwasaki et al. | |
| 5,793,279 A | 8/1998 | Nepela | |
| 5,903,708 A | 5/1999 | Kano et al. | |
| 6,201,617 B1 | 3/2001 | Kusaka | |
| 6,205,008 B1 | 3/2001 | Gijs et al. | |
| 6,375,761 B1 | 4/2002 | Gambino et al. | |
| 6,693,776 B2 | 2/2004 | Gill | |
| 6,828,897 B1 | 12/2004 | Nepela | |
| 6,876,522 B2 * | 4/2005 | Ambrose et al. | 360/324.11 |
| 6,917,088 B2 | 7/2005 | Takahashi et al. | |
| 7,295,408 B2 * | 11/2007 | Saito et al. | 360/324.1 |
| 7,301,733 B1 * | 11/2007 | Fukuzawa et al. | 360/324.1 |
| 2003/0197986 A1 * | 10/2003 | Ambrose et al. | 360/324.11 |
| 2004/0165320 A1 | 8/2004 | Carey et al. | |

(Continued)

FOREIGN PATENT DOCUMENTS

CN    2006101485452    10/2006

(Continued)

OTHER PUBLICATIONS

Chris Palmstrom, "Epitaxial Heusler Alloys: New Materials for Semiconductor Spintronics," MRS Bulletin, Oct. 2003.

(Continued)

*Primary Examiner*—Mark Blouin
(74) *Attorney, Agent, or Firm*—Zilka-Kotab, PC

(57) ABSTRACT

A magnetic head including a CPP GMR read sensor that includes a reference layer, a free magnetic layer and a spacer layer that is disposed between them, where the free magnetic layer and the reference magnetic layer are each comprised of $Co_2MnX$ where X is a material selected from the group consisting of Ge, Si, Al, Ga and Sn, and where the spacer layer is comprised of a material selected from the group consisting of $Ni_3Sn$, $Ni_3Sb$, $Ni_2LiGe$, $Ni_2LiSi$, $Ni_2CuSn$, $Ni_2CuSb$, $Cu_2NiSn$, $Cu_2NiSb$, $Cu_2LiGe$ and $Ag_2LiSn$.

Further embodiments include a dual spin valve sensor where the free magnetic layers and the reference layers are each comprised of Heusler alloys.

A further illustrative embodiment includes a laminated magnetic layer structure where the magnetic layers are each comprised of a ferromagnetic Heusler alloy, and where the spacer layers are comprised of a nonmagnetic Heusler alloy.

23 Claims, 4 Drawing Sheets

U.S. PATENT DOCUMENTS

| | | | |
|---|---|---|---|
| 2005/0073778 A1* | 4/2005 | Hasegawa et al. | 360/324.1 |
| 2005/0074634 A1 | 4/2005 | Hasegawa et al. | |
| 2005/0280958 A1* | 12/2005 | Saito et al. | 360/324.12 |
| 2006/0002039 A1* | 1/2006 | Hasegawa et al. | 360/324.11 |
| 2006/0050446 A1* | 3/2006 | Ishizone et al. | 360/324.12 |

FOREIGN PATENT DOCUMENTS

| | | |
|---|---|---|
| JP | 07-147437 | 6/1995 |
| JP | 7147437 | 6/1995 |
| JP | 11-031312 | 2/1999 |
| JP | 2004146480 | 5/2004 |

OTHER PUBLICATIONS

J. Kudrnovsky and V. Drchal, Interlayer magnetic coupling: Effect of alloying in the spacer, Physical Review B, vol. 54, No. 6, Aug. 1, 1996.

Paul R. Johnson, Observation of Giant Magnetoresistance in a Heusler Alloy Spin Valve, IEEE Transactions of Magnetics, vol. 32, No. 5, Sep. 1996.

C. Hordequin, J.P. Nozieres, J. Pierre, Half metallic NiMnSb-based spin-valve structures, Journal of Magnetism and Magnetic Materials 183 (1998) 225-231.

J. A. Cabllero et al., Effect of deposition parameters on the CPP-GMR of NiMnSb-Based spin-valve structures, Journal of Magnetism and Magnetic Materials 198- 1999 (1999) 55-57.

N.N. Lathiotakis and B. G. Gyorffy, Oscillatory exchange coupling across $Cu_{1-x}Ni_x$ spacers: . . . , Physical Review B, vol. 62, No. 13, Oct. 1, 2000—1.

Yasemin Kurtulus et al.; Electronic structure and magnetic exchange coupling in ferromagnetic full Heusler alloys, Physical Review B 71, 2005.

* cited by examiner

MAGNETIC HEAD WITH IMPROVED CPP SENSOR USING HEUSLER ALLOYS

BACKGROUND OF THE INVENTION

1. Field of the Invention

The present invention relates generally to giant magnetoresistive (GMR) read head sensors for magnetic heads, and more particularly to improved CPP sensor structures in which Heusler alloys are utilized.

2. Description of the Prior Art

A hard disk drive stores and retrieves data by positioning a magnetic read/write head over a rotating magnetic data storage disk, where the magnetic head, or heads, read from or write data to concentric data tracks defined on surface of the disks. The goal in recent years is to increase the amount of data that can be stored on each hard disk. Increasing the areal data storage density of the disks can be accomplished by reducing the size of data bits, such that the number of tracks per inch (tpi) and bits per inch (bpi) on the data tracks on the disk can be increased. However, to read data from a disk with an increased bpi, it is also necessary to develop a sufficiently sensitive sensor structure with reduced noise within the read head of the magnetic head, such that data bits can be detected and read.

A read head typically includes a giant magnetoresistive (GMR) spin valve sensor structure for reading the data from the disk of the hard disk drive. As is well known to those skilled in the art, such GMR sensor structures include a plurality of thin film layers disposed between two magnetic shields that define the read gap. The thin film layers have particular magnetic properties, and are sensitive to the magnetic field of the data bits on the hard disk. Thus, more sensitive sensor layers with lower noise characteristics disposed between the two magnetic shields allow the read head to detect the smaller data bits that a higher bpi data track contains.

The thin film layers of a typical GMR spin valve sensor will include at least a reference magnetic layer, a non-magnetic spacer layer, and a free magnetic layer. In operation the magnetic moment of the free layer is free to rotate within the layer with respect to the ABS from a quiescent or zero bias point position in response to magnetic flux from data bits located on the rotating magnetic disk. For read head applications the magnetization of the reference layer is typically fixed in a directed substantially perpendicular to the ABS, while the direction of the free layer is typically directed substantially parallel to the ABS. In the following description, substantially parallel means closer to parallel than perpendicular, substantially perpendicular means closer to perpendicular than parallel.

There are generally two ways to provide sense current to the read head. The older way is by supplying a current that runs longitudinally in the plane of the ABS from one side of the free magnetic layer to the other side. A more recent design is to supply the sense current perpendicularly to the plane (CPP) of the central layer stack, that is, between the magnetic shields. In such CPP head designs the magnetic shields are typically used as the electrical leads and the sense current flows through the various layers of the sensor that are disposed between the magnetic shields.

When a spin valve sensor employs a single pinned layer it is referred to as a simple spin valve. When a spin valve sensor employs an antiparallel (AP) pinned layer structure it is referred to as an AP-pinned spin valve. An AP-pinned spin valve includes first magnetic (AP1) and second magnetic (AP2) layers separated by a thin non-magnetic coupling layer such as Ru or Ir. The thickness of the coupling layer is chosen so as to antiparallel couple the magnetic moments of the first and second ferromagnetic layers of the pinned layer structure.

The magnetization of the pinned layer is usually fixed by exchange coupling one of the ferromagnetic layers (AP1) with a layer of antiferromagnetic material (AFM) such as PtMn, IrMn, or IrMnCr. While an antiferromagnetic (AFM) material such as PtMn does not in and of itself have a net magnetic moment, when exchange coupled with a magnetic material, it can strongly pin the magnetization of a ferromagnetic layer. In an AP-pinned spin-valve the AP1 layer adjacent and pinned by the AFM is usually referred to as the pinned layer while the AP2 layer adjacent to the spacer layer is usually referred to as reference layer. In a simple spin-valve the pinned layer is also acting as reference layer. The following description will simply refer to the layer adjacent to the non-magnetic spacer layer (the AP2 in an AP-pinned spin-valve and the pinned layer in a simple spin-valve) as the reference layer. A spin valve sensor is also known as a top or bottom spin valve sensor depending upon whether the reference layer is at the top (formed after the free layer) or at the bottom (before the free layer).

In the ongoing efforts to identify magnetic and nonmagnetic sensor layer materials that can improve sensor performance, Heusler alloys have recently been demonstrated to provide improved sensor performance. A Heusler alloy has the chemical formula $A_2MnB$, where A and B are metals or semiconductors. Recently, U.S. Pat. No. 6,876,522, issued Apr. 5, 2005 to Ambrose et al. has identified particular Heusler alloys that may be utilized for the reference magnetic layer, spacer layer and free magnetic layer of a GMR sensor. While the Heusler alloys identified in this patent provide improved sensor performance, there is a need for the identification and utilization of further Heusler alloys, not identified in this patent, that when used in appropriate combinations and sensor layer configurations provide still further enhanced performance for a GMR sensor.

SUMMARY OF THE INVENTION

A magnetic head of the present invention includes a GMR read sensor including a plurality of thin film layers that are disposed in a central stack between the magnetic shields. The sense current is directed between the shields in a current perpendicular to the plane (CPP) design. The sensor includes a reference magnetic layer, a free magnetic layer and a spacer layer that is disposed between them, where the free magnetic layer and the reference magnetic layer are each comprised of $Co_2MnX$ where X is a material selected from the group consisting of Ge, Si, Al, Ga and Sn, and where the spacer layer is comprised of a material selected from the group consisting of $Ni_3Sn$, $Ni_3Sb$, $Ni_2LiGe$, $Ni_2LiSi$, $Ni_2CuSn$, $Ni_2CuSb$, $Cu_2NiSn$, $Cu_2NiSb$, $Cu_2LiGe$ and $Ag_2LiSn$.

Further embodiments include a multilayer sensor having a first reference magnetic layer, a first spacer layer, a free magnetic layer, a second spacer layer and a second reference magnetic layer, where the free magnetic layers and the reference magnetic layers are each comprised of a Heusler alloy, such as $Co_2MnX$ where X is a material selected from the group consisting of Ge, Si, Al, Ga and Sn, and where the spacer layer is comprised of a Heusler alloy that may be a material selected from the group consisting of $Ni_3Sn$, $Ni_3Sb$, $Ni_2LiGe$, $Ni_2LiSi$, $Ni_2CuSn$, $Ni_2CuSb$, $Cu_2NiSn$, $Cu_2NiSb$, $Cu_2LiGe$ and $Ag_2LiSn$.

A spin valve in which a single magnetic layer is used as the pinned layer is referred to as a simple spin valve. In this case, this single magnetic layer is also referred to as the "reference"

layer. A plurality of magnetic layers can be used as the pinned layer, as in the case of pinning/nonmagnetic/reference. In this case, the nonmagnetic layer material and thickness is chosen such that the magnetic moments of the pinned and reference layers are aligned antiparallel (AP) in zero field. The reference layer is in contact with the spin valve spacer layer. In this case, typically the reference layer would be a Heusler alloy, and the pinning layer would be substantially non-Heusler magnetic material.

A further illustrative embodiment includes a laminated magnetic layer structure having a plurality of magnetic layers that are separated by spacer layers, where the magnetic layers are each comprised of a Heusler alloy, such as $Co_2MnX$ where X is a material selected from the group consisting of Ge, Si, Al, Ga and Sn, and where the spacer layers are comprised of a Heusler alloy, such as a material selected from the group consisting of $Ni_3Sn$, $Ni_3Sb$, $Ni_2LiGe$, $Ni_2LiSi$, $Ni_2CuSn$, $Ni_2CuSb$, $Cu_2NiSn$, $Cu_2NiSb$, $Cu_2LiGe$ and $Ag_2LiSn$. When the laminated magnetic layer structure is utilized as a reference magnetic layer or a free magnetic layer in a sensor device, the direction of magnetization of each of the magnetic layers within the laminated magnetic layer structure is in the same direction. Incorporation of the laminated magnetic layer structure into CPP GMR sensors is described.

It is an advantage of the magnetic head of the present invention that it includes a magnetoresistive read head having increased sensitivity.

It is a further advantage of the magnetic head of the present invention that it includes a sensor in which ferromagnetic Heusler alloys are utilized within the reference and free magnetic layers and nonmagnetic Heusler alloys are utilized within the spacer layers, where there is an improved energy band and lattice spacing match between the ferromagnetic Heusler alloys and the nonmagnetic Heusler alloys.

It is an advantage of the hard disk drive of the present invention that it includes a magnetic head of the present invention having a magnetoresistive spin valve sensor having increased sensitivity.

It is a further advantage of the hard disk drive of the present invention that it includes a magnetic head of the present invention that includes a sensor in which ferromagnetic Heusler alloys are utilized within the reference and free magnetic layers and nonmagnetic Heusler alloys are utilized within the spacer layers, where there is an improved energy band and lattice spacing match between the ferromagnetic Heusler alloys and the nonmagnetic Heusler alloys.

These and other features and advantages of the present invention will no doubt become apparent to those skilled in the art upon reading the following detailed description which makes reference to the several figures of the drawing.

IN THE DRAWINGS

The following drawings are not made to scale as an actual device, and are provided for illustration of the invention described herein.

DETAILED DESCRIPTION OF THE PREFERRED EMBODIMENTS

Figure 1:
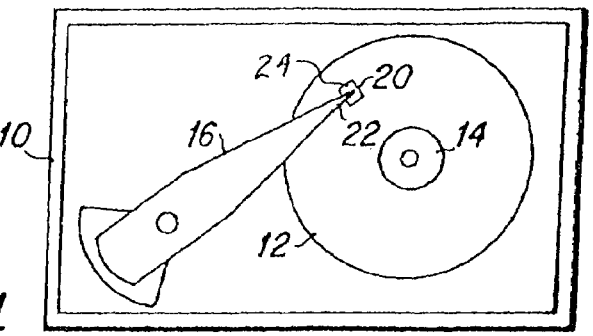
FIG. 1 is a top plan view generally depicting a hard disk drive that includes a magnetic head of the present invention.

FIG. 1 is a top plan view that depicts significant components of a hard disk drive which includes a magnetic head of the present invention. The hard disk drive 10 includes a magnetic media hard disk 12 that is rotatably mounted upon a motorized spindle 14. An actuator arm 16 is pivotally mounted within the hard disk drive 10 with a magnetic head 20 of the present invention being fabricated upon a slider 24 that is disposed upon a distal end 22 of the actuator arm 16. A typical hard disk drive 10 may include a plurality of disks 12 that are rotatably mounted upon the spindle 14 and a plurality of actuator arms 16 having a slider 24 mounted upon the distal end 22 of each of the actuator arms. As is well known to those skilled in the art, when the hard disk drive 10 is operated, the hard disk 12 rotates upon the spindle 14 and the slider 24 acts as an air bearing that is adapted for flying above the surface of the rotating disk. The slider 24 includes a substrate base upon which the various layers and structures that form the magnetic head 20 are fabricated. Such heads are fabricated in large quantities upon a wafer substrate and subsequently sliced into discrete magnetic heads 20.

Figure 2:
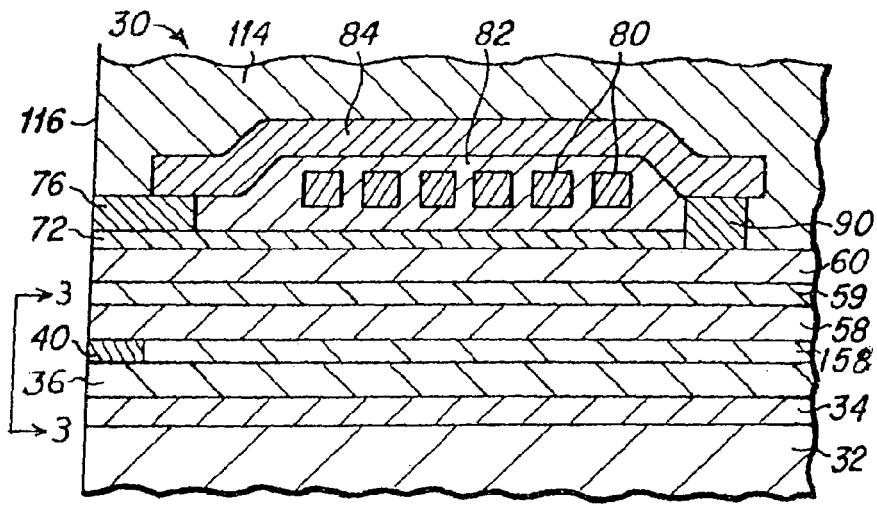
FIG. 2 is a side cross-sectional view depicting a typical prior art magnetic head.
Figure 3:
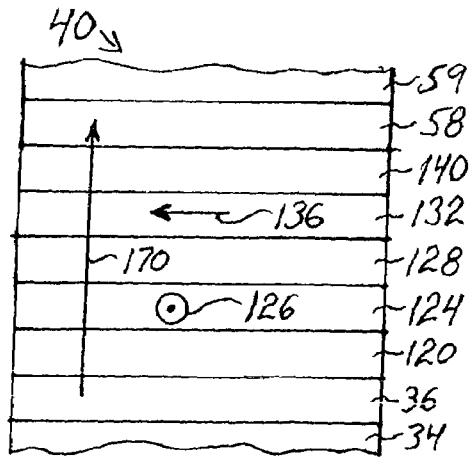
FIG. 3 is a plan view of the read head portion of the magnetic head depicted in FIG. 2, taken from the air bearing surface (ABS), and particularly along lines 3-3 of FIG. 2.

A typical prior art magnetic head structure is next described with the aid of FIGS. 2 and 3 to provide a basis for understanding the improvements of the present invention. As will be understood by those skilled in the art, FIG. 2 is a side cross-sectional view that depicts portions of a prior art magnetic head 30, and FIG. 3 is an elevational view of the read head sensor portion of the prior art magnetic head 30 depicted in FIG. 2, taken from lines 3-3 of the air bearing surface of FIG. 2.

As depicted in FIGS. 2 and 3, a typical prior art magnetic head 30 includes a substrate base 32 of the slider 24 with an insulation layer 34 formed thereon, and a first magnetic shield (S1) 36 that is fabricated upon the insulation layer. A read head sensor 40, comprising a plurality of layers of specifically chosen materials, is then fabricated upon the S1 shield 36, and a detailed description of the sensor 40 is provided hereinbelow with the aid of FIG. 3. Following the fabrication of the sensor 40 a second magnetic shield (S2) 58 is fabricated upon the sensor 40, and an electrical insulation layer 59 is then deposited upon the S2 shield 58. A write head portion of the magnetic head 30 is next fabricated.

An embodiment of a write head portion of the prior art magnetic head 30 includes a first magnetic pole (P1) 60 that is fabricated upon the insulation layer 59. Following the fabrication of the P1 pole 60, a write gap layer 72 typically composed of a non-magnetic material such as alumina is deposited upon the P1 pole 60. This is followed by the fabrication of a P2 magnetic pole tip 76 and an induction coil structure, including coil turns 80, that is then fabricated within insulation 82 above the write gap layer 72. Thereafter, a yoke portion 84 of the second magnetic pole is fabricated in magnetic connection with the P2 pole tip 76, and through back gap element 90 to the P1 pole 60. Electrical leads (not shown) to the induction coil are subsequently fabricated and a further insulation layer 114 is deposited to encapsulate the magnetic head. The magnetic head 30 is subsequently fabricated such that an air bearing surface (ABS) 116 is created. Alternatively, other write head configurations as are known to those skilled in the art may be fabricated upon the sensor 40.

It is to be understood that there are many detailed features and fabrication steps of the magnetic head 30 that are well known to those skilled in the art, and which are not deemed necessary to describe herein in order to provide a full understanding of the present invention.

The present invention is directed towards improvements in the specific layers that comprise the sensor 40 of the read head, and a more detailed depiction of a prior art sensor such as may be utilized as sensor 40 in the prior art magnetic head of FIG. 2 is depicted in FIG. 3; such a sensor is described in U.S. Pat. No. 6,876,522 issued Apr. 5, 2005 to Ambrose et al. As depicted in FIG. 3, the S1 magnetic shield 36 is fabricated upon the insulation layer 34. An antiferromagnetic (AFM) layer 120, typically comprised of a material such as PtMn, IrMn, or IrMnCr, is deposited upon the S1 shield 36. Thereafter, a pinned magnetic layer structure 124 is deposited upon the AFM layer 120. The pinned magnetic layer structure 124 includes a reference layer (not separately shown) where the magnetization of the reference layer (see arrow 126) is directed substantially perpendicular to the ABS plane of the magnetic head, such as out of the plane of FIG. 3. The AFM layer 120 serves to pin the magnetic field of the reference layer in that direction. Thereafter, a non-magnetic spacer layer 128 is deposited upon the pinned magnetic layer structure 124. A free magnetic layer 132 is then fabricated upon the spacer layer 128. The free magnetic layer 132 is formed with a magnetization direction that is in the ABS plane of the magnetic head (see arrow 136). A magnetic biasing layer structure 140 may be fabricated upon the free magnetic layer 132 to bias the direction of magnetization 136 of the free magnetic layer, as is known to those skilled in the art. A cap layer (not separately shown) may be deposited as a part of the bias layer structure 140. Thereafter, the second magnetic shield 58 is fabricated upon the bias layer structure 140. The insulation layer 59 is next deposited upon the S2 shield 58 and the write head portion of the magnetic head is then fabricated, as has been described hereabove. In this configuration of a read head, the direction of the sense current (see arrow 170) is perpendicular to the plane (CPP) of the magnetic shield layers 36 and 58, and the magnetic shields are utilized as electrical leads for supplying current to the read sensor 40 which lies between them. As is seen in FIG. 2, an insulation layer 158 is also fabricated to separate the S1 and S2 shield electrical leads in the area behind the read sensor 40, so that they do not short out along their length.

Figure 5:
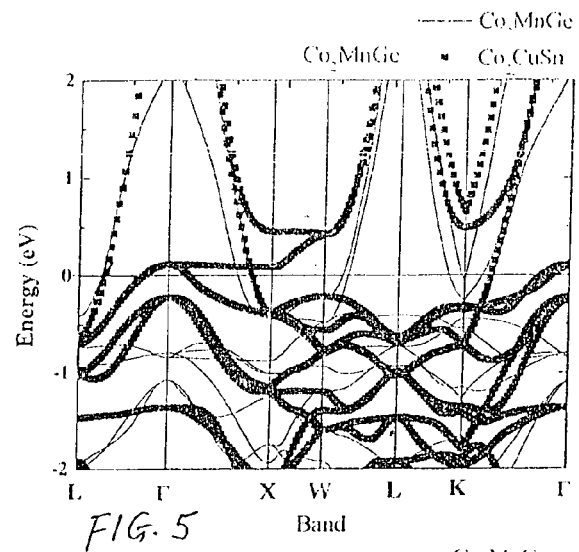
FIG. 5 is an energy band graph which shows the energy bands for the prior art $Co_2MnGe$ and $Co_2CuSn$ Heusler alloys.
Figure 6:
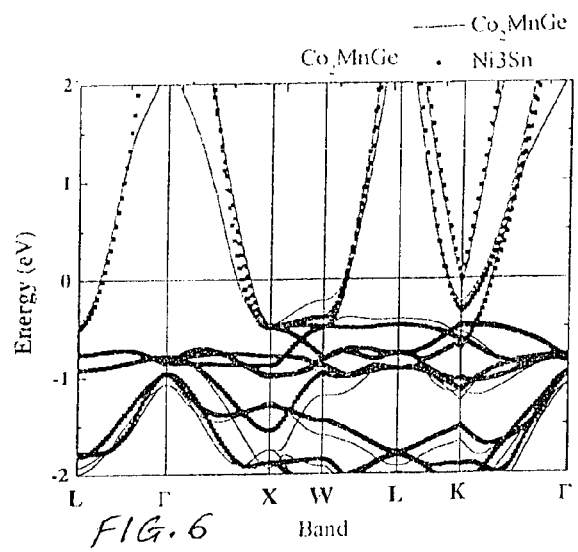
FIGS. 6-13 are energy band graphs which show the energy bands for some of the Heusler alloys identified in the present invention.
Figure 7:
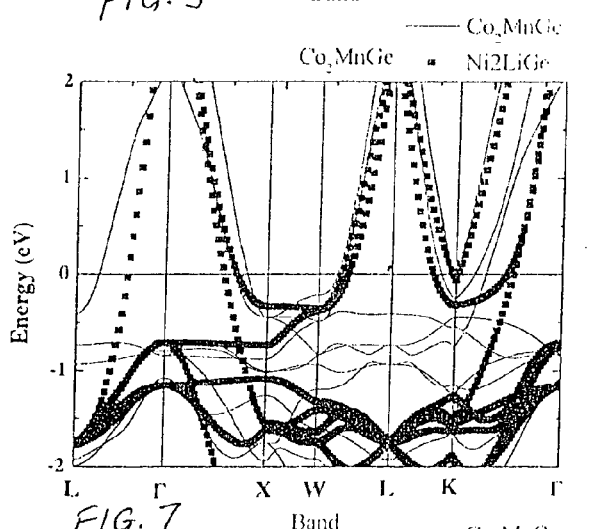
Figure 8:
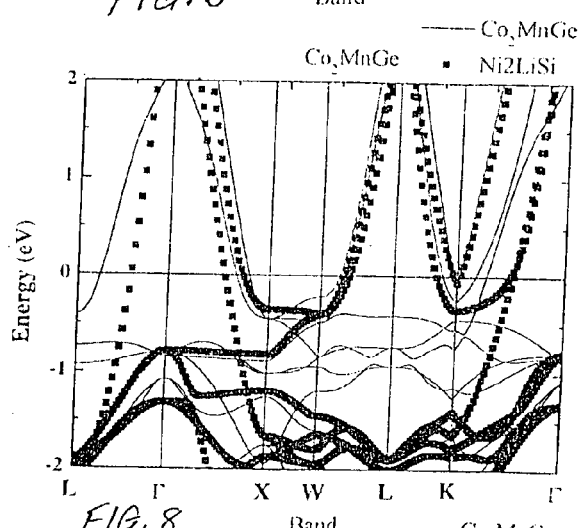
Figure 9:
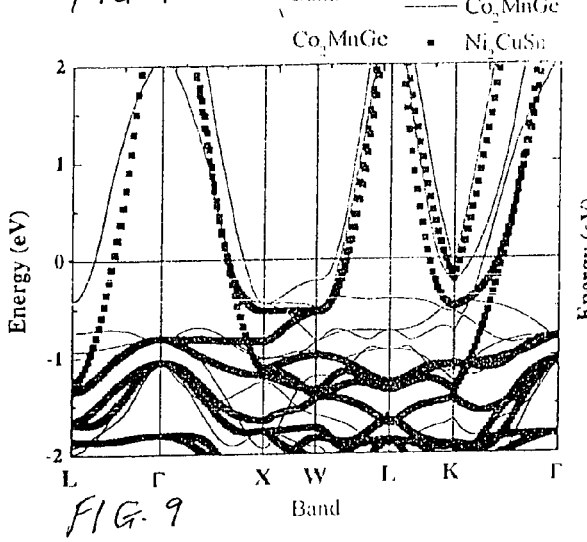
Figure 10:
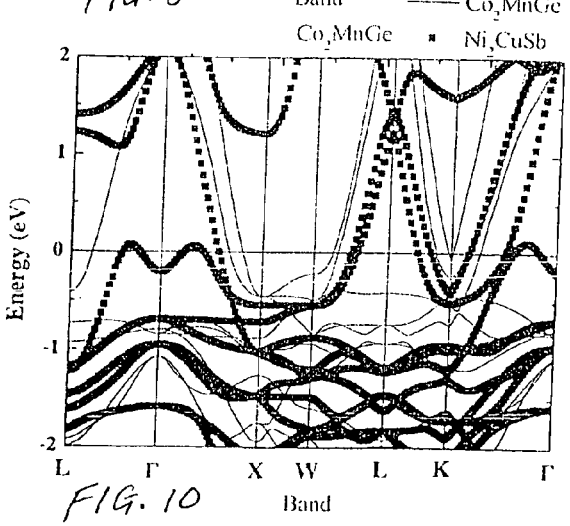
Figure 11:
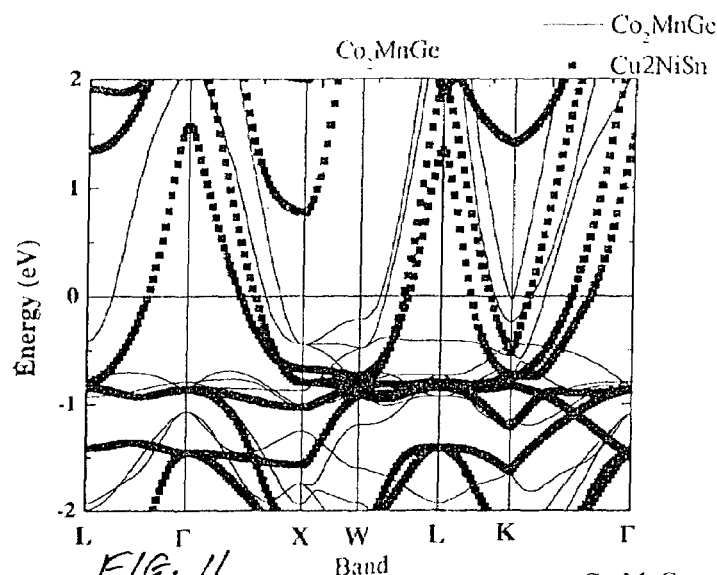

As is described in the Ambrose et al. patent identified above, the reference and free magnetic layers 124 and 132 respectively may be composed of ferromagnetic Heusler alloys $Co_2MnGe$ or $Co_2MnSi$, and the spacer layer may be advantageously composed of a nonmagnetic Heusler alloy $Co_2CuSn$ or $Rh_2CuSn$. Where these particular Heusler alloy materials are utilized, there is an adequate electronic energy band matching and small crystal lattice mismatch between them. The use of such Heusler alloys creates a sensor having an enhanced GMR effect. Specifically, an energy band graph which shows the energy bands for $Co_2MnGe$ and $Co_2CuSn$ is presented in FIG. 5; these are two of the Heusler alloys identified in Ambrose, et al. While it can be seen that there is a close correspondence in the energy bands, when focusing on the "K" and "W" symmetry points of the Brillouin zone it can be seen that there is some disparity between the energy levels of the ferromagnetic $Co_2MnGe$ alloy and the nonmagnetic $Co_2CuSn$ alloy. This comparison is especially important near zero energy—the Fermi energy, $E_F$. The existence of lines and the slope of the lines should be similar near $E_F$. Heusler alloys having a better energy band match are presented herein.

Figure 4:
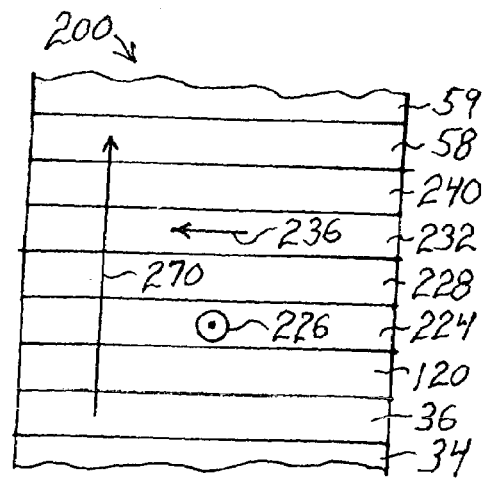
FIG. 4 is an ABS view depicting a first embodiment of a sensor structure of the present invention.

A first illustrative embodiment of an improved sensor 200 of the present invention is depicted in FIG. 4. As will be seen by comparing the prior art sensor 40 of FIG. 3 with the sensor 200 of the present invention of FIG. 4, the improvements of the sensor 200 are obtained through the use of a spacer layer comprised of nonmagnetic Heusler alloys that have an improved electronic band matching with the ferromagnetic Heusler alloys that comprise the reference and free magnetic layers. Specifically, as depicted in FIG. 4, the sensor 200 of the present invention includes an antiferromagnetic (AFM) layer 120 that is typically comprised of a material such as IrMn, IrMnCr or PtMn, which is deposited upon the S1 shield 36. Underlayers and seedlayers may be deposited between S1 and the AFM layer to promote the correct crystal structure, as is known to those skilled in the art.

A pinned magnetic layer structure 224 is next fabricated upon the AFM layer 120. A thin layer of CoFe or other magnetic alloy may be required between the AFM and the pinned magnetic layer structure 224. A spin valve in which a single magnetic layer is used as the pinned magnetic layer is referred to as a simple spin valve. In this case, this single magnetic layer is also referred to as the "reference" layer. A plurality of magnetic layers can also be used as the pinned magnetic layer structure, as in the case of pinning/nonmagnetic/reference layers. In this case, the pinning layer is composed of a magnetic material such as Co, Fe, Ni or other alloys. The nonmagnetic layer is an AP spacer layer and the material and thickness is chosen such that the magnetic moments of the pinned and reference layers are aligned antiparallel (AP) in zero field. The reference layer is fabricated in contact with the spin valve spacer layer. In this case, typically the reference layer would be a Heusler alloy, and the pinning layer would be a substantially non-Heusler magnetic material. In the present invention the reference layer is comprised of a ferromagnetic Heusler alloy, particularly such as $Co_2MnX$ where X is selected from the group consisting of Ge, Si, Al, Ga and Sn, which is identified herein as the ferromagnetic Heusler alloy group HFM. The pinned layer structure 224 is fabricated with a magnetization (see arrow 226) that is directed substantially perpendicular to the ABS plane of the magnetic head, such as out of the plane of FIG. 4, and the AFM layer 120 serves to pin the magnetization of the pinned layer structure 224 in that direction.

Thereafter, a spacer layer 228 is deposited upon the pinned magnetic layer 224. The spacer layer 228 is comprised of a nonmagnetic Heusler alloy chosen from the group consisting of $Ni_3Sn$, $Ni_3Sb$, $Ni_2LiGe$, $Ni_2LiSi$, $Ni_2CuSn$, $Ni_2CuSb$, $Cu_2NiSn$, $Cu_2NiSb$, $Cu_2LiGe$ and $Ag_2LiSn$, which is identified as the nonmagnetic Heusler alloy group HNM hereinbelow. A free magnetic layer 232 is then fabricated upon the spacer layer 228. The free magnetic layer is comprised of a Heusler alloy from the HFM group, and is formed with a magnetization that is in the plane of the magnetic head (see arrow 236). In the embodiment 200 the reference magnetic layer is formed with a thickness of from approximately 10 Å to approximately 100 Å, and preferably approximately 40 Å. The spacer layer is formed with a thickness of from approximately 15 Å to approximately 50 Å and preferably approximately 30 Å, and the free magnetic layer is formed with a thickness of from approximately 10 Å to approximately 100 Å and preferably approximately 40 Å.

An in-stack bias layer structure 240 comprised of a non-magnetic spacer layer and a magnetic in-stack biasing layer (not separately shown) may be fabricated upon the free magnetic layer 232. The magnetization of the in-stack bias layer is directed substantially parallel to the ABS and substantially antiparallel to the free layer. Such an in-stack bias layer structure biases the magnetization 236 of the free layer via magneto-static coupling as is known to those skilled in the art. The magnetization of the in-stack bias layer is usually pinned by an AFM (not separately shown), and a cap layer (not separately shown) may be deposited to cap the bias layer structure 240.

Thereafter, the fabrication of the second magnetic shield 58 is fabricated upon the bias layer structure 240. The insulation layer 59 is next deposited upon the S2 shield 58 and the write head portion of the magnetic head is then fabricated, as has been described hereabove. In this configuration of a read head, the direction of the sense current (see arrow 270) is perpendicular to the plane (CPP) of the magnetic shield layers 36 and 58, and the magnetic shields are utilized as electrical leads for supplying current to the read sensor 200 which lies between them.

Figure 12:
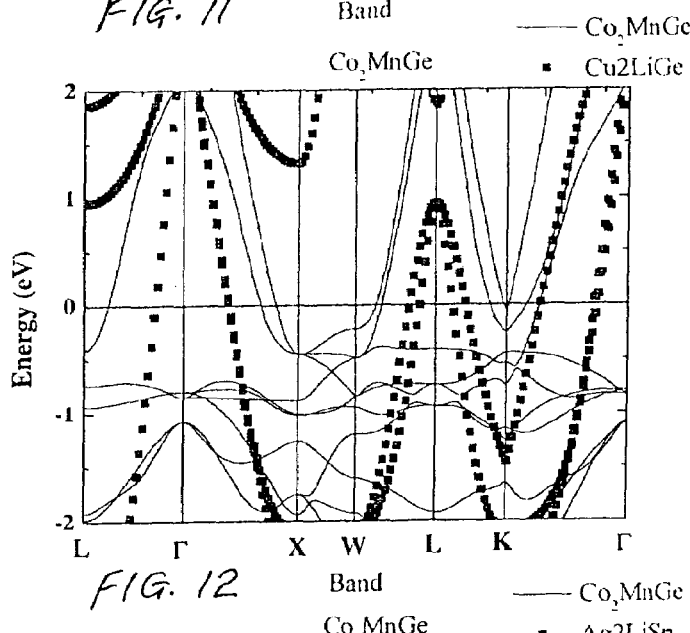
Figure 13:
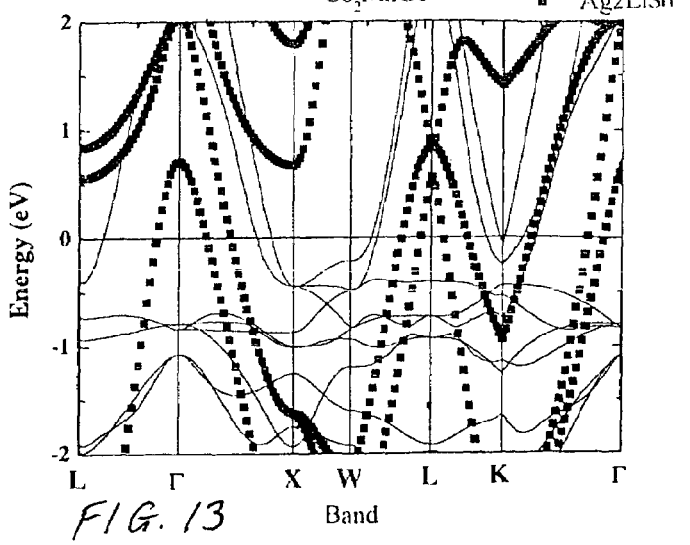

The nonmagnetic Heusler alloys (HNM) identified above of the spacer layer 228 provide an improved electronic energy band match with the above-mentioned ferromagnetic Heusler alloys of (HFM) the reference and free magnetic layers as compared to those identified in the prior art. Particularly, FIGS. 6-13 depict the band matching of the above-identified nonmagnetic Heusler alloy spacer materials (HNM) with a ferromagnetic Heusler alloy $Co_2MnGe$, which may serve as the pinning magnetic layer and/or free magnetic layer material of a sensor. As can generally be seen in FIGS. 6-13, the band matching to the spin 1 band of $Co_2MnGe$ is excellent. Particularly, near the "W" and "K" symmetry points of the Brillouin zone, the match of the slope of the lines indicates that there are states with similar energies in both the $Co_2MnGe$ and the HNM materials. The match is significantly better than $Co_2MnGe$ prior art nonmagnetic Heusler alloy spacer material depicted in FIG. 5. In FIGS. 12 and 13, the shape of the curves is a good match, except that they are offset in energy. Stress can shift the Fermi energy of a material, as described in "Bandstructure calculations of the half-metallic ferromagnetism and structural stability of full- and half-Heusler phases" by T. Block, M. J. Carey and B. A. Gurney in Phys. Rev. B 70, p. 205114 (2004). Also, proximity to materials with a different Fermi energy can shift the Fermi energy. With such a shift, the materials in FIGS. 12 and 13 would be a better band structure match than the $Co_2CuSn$ prior art.

Figure 14:
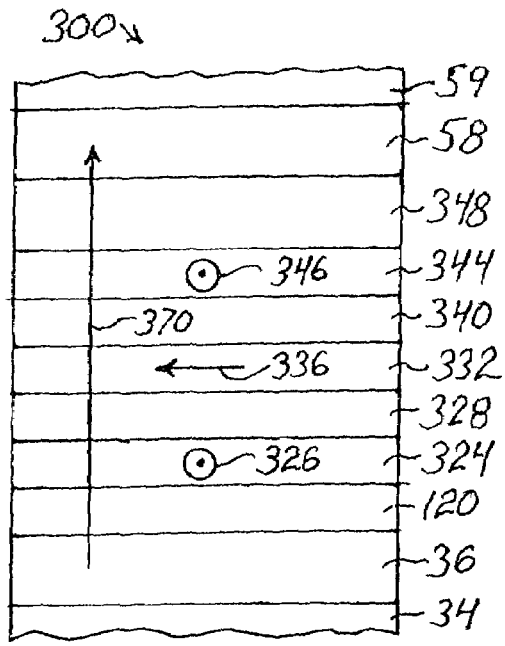
FIG. 14 is an ABS view depicting another embodiment of a sensor structure of the present invention.

A further illustrative embodiment of a sensor 300 of the present invention, a dual spin-valve, is depicted in FIG. 14. As depicted therein, the sensor 300 includes a first magnetic shield 36 that is fabricated upon an insulation layer 34. An antiferromagnetic (AFM) layer 120, typically comprised of a material such as PtMn, IrMn or IrMnCr is deposited upon the shield 36. Seedlayers may be used between S1 and the AFM to promote the correct crystal structure, as is known to those skilled in the art. Thereafter, a first pinned magnetic layer structure 324 is deposited upon the AFM layer 120. For a simple spin valve, the pinned magnetic layer structure is comprised of a ferromagnetic Heusler alloy material, such as a material from the group HFM identified above, and is fabricated with a magnetization (see arrow 326) that is directed substantially perpendicular to the ABS plane of the magnetic head. In the case of an AP pinned spin valve, the pinned layer structure would be formed of CoFe alloy/Ru/thin CoFe alloy/Heusler alloy, where the Heusler alloy is a material from the HFM group. Thereafter, a spacer layer 328, that is comprised of a nonmagnetic Heusler alloy, such as a material selected from the group HNM, is deposited upon the pinned magnetic layer 324. A free magnetic layer 332 comprised of a ferromagnetic Heusler alloy, such as a material selected from the group HFM is then fabricated upon the spacer layer 328 with a magnetization (see arrow 336) that is in the ABS plane of the magnetic head. A second spacer layer 340 comprised of a nonmagnetic Heusler alloy, such as a material selected from the group HNM is then deposited upon the free magnetic layer 332. Thereafter, a second pinned magnetic layer 344, with a reference layer comprised of a ferromagnetic Heusler alloy, such as a material selected from the group HFM is fabricated upon the second spacer layer 340. Thereafter, a second antiferromagnetic layer 348, typically comprised of a material such as PtMn, IrMn, or IrMnCr, is deposited upon the second pinned magnetic layer 344, such that the magnetization of the second pinned magnetic layer is directed substantially perpendicular to the ABS plane of the magnetic head (see arrow 346). Thereafter, the second magnetic shield 58 is fabricated upon the second AFM layer 348. The insulation layer 59 is next deposited upon the S2 shield 58 and the write head portion of the magnetic head is then fabricated, as has been described hereabove. In this configuration of a read head, the direction of the sense current (see arrow 370) is perpendicular to the plane (CPP) of the magnetic shield layers 36 and 58, and the magnetic shields are utilized as electrical leads for supplying current to the read sensor 300 which lies between them. In the embodiment 300 the reference magnetic layers 324 and 344 are formed with a thickness of from approximately 10 Å to approximately 100 Å, and preferably approximately 45 Å. The spacer layers 328 and 340 are formed with a thickness of from approximately 15 Å to approximately 100 Å and preferably approximately 25 Å, and the free magnetic layer 332 is formed with a thickness of from approximately 10 Å to approximately 100 Å and preferably approximately 50 Å.

Spin transfer torques can be observed in CPP spin valves (see for example J. G. Zhu et al., IEEE Trans. Magn., 40, 2323 (2004)). This can result in high-frequency noise which can limit the signal-to-noise ratio of the spin valve sensor. Spin transfer torques become more prominent when the spin polarization of the magnetic layers is increased. Since HFM are predicted to be fully spin polarized, the effects are pronounced when they are used in single spin valves. Spin transfer torques can cause the free layer moment to oscillate at high frequency, resulting in significant high frequency noise. The symmetrical structure of the dual spin valve is useful to reduce or eliminate spin transfer torque noise.

Figure 15:
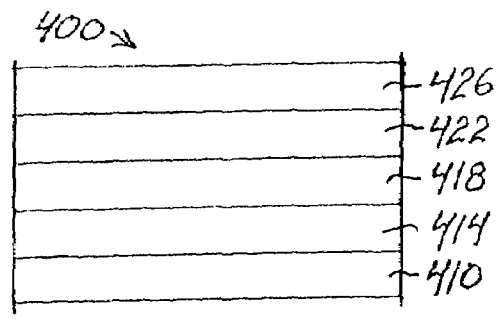
FIG. 15 is an ABS view depicting a laminated magnetic layer structure of the present invention.

A further illustrative embodiment of a feature of the present invention is depicted in FIG. 15, wherein a laminated magnetic layer 400 is shown. It is generally known that increasing the number of magnetic/non-magnetic interfaces can significantly increase the signal from CPP-GMR sensors. This has been shown in the case of magnetic CoFe alloys with band-matched non-magnetic Cu, Yuasa H, Fukuzawa H, Iwasaki H, et al., "The Number of Cu Lamination Effect on Current-perpendicular-to-plane Giant-Magnetoresistance of Spin Valves with Fe50Co50 Alloy", Journal of Applied Physics, 97 (11): Art. No. 113907 Jun. 1, 2005. As depicted in FIG. 15, the laminated magnetic layer 400 generally comprises a layer structure including a plurality of magnetic layers comprised of a ferromagnetic Heusler alloy, such as a material selected from the HFM group, that are separated by spacer layers comprised of a nonmagnetic Heusler alloy, such as a material selected from the HNM group. Specifically, the illustrative laminated magnetic layer structure 400 includes a first magnetic layer 410 which is comprised of a ferromagnetic Heusler alloy, such as a material from the HFM group, and may have a thickness of from approximately 5 to approximately 50 Å, and preferably approximately 10 Å. Thereafter, a first spacer layer 414 is fabricated upon the first magnetic layer 410. The first spacer layer 414 is comprised of a nonmagnetic Heusler alloy, such as a material selected from the HNM group, and may be fabricated with a thickness from approximately 5 to approximately 50 Å, and preferably approximately 10 Å. Thereafter, a second magnetic layer 418 is fabricated upon the first spacer layer 414, where the second magnetic layer is comprised of a ferromagnetic Heusler alloy, such as a material from the HFM group and formed with a thickness of from approximately 5 to approximately 50 Å, and preferably approximately 10 Å. Thereafter, a second spacer layer 422 is fabricated upon the second magnetic layer 418, where the second spacer layer 422 is comprised of a nonmagnetic Heusler alloy, such as a material from the HNM group, and has a thickness of from approximately 5 to approximately 50 Å, and preferably approximately 10 Å. Thereafter, a third magnetic layer 426 is fabricated upon the second spacer layer 422, where the third magnetic layer 426 is comprised of a ferromagnetic Heusler alloy, such as a material from the HFM group, and has a thickness of from approximately 5 to approximately 50 Å, and preferably approximately 10 Å. As can therefore be seen, the laminated magnetic layer 400 has a basic laminated structure that begins and ends with a magnetic layer (410 and 426) and has alternating spacer and magnetic layers therewithin. It is not to be limited to the five layer structure depicted in FIG. 15, but may have as few as three layers, and is not limited in the total number of layers, except as to limitations of the overall thickness of the entire laminated structure, as it may be included as a pinned or free magnetic layer within a sensor, as is next described. This laminated magnetic layer structure 400 is referred to as a magnetic layer structure HL hereinbelow.

Figure 16:
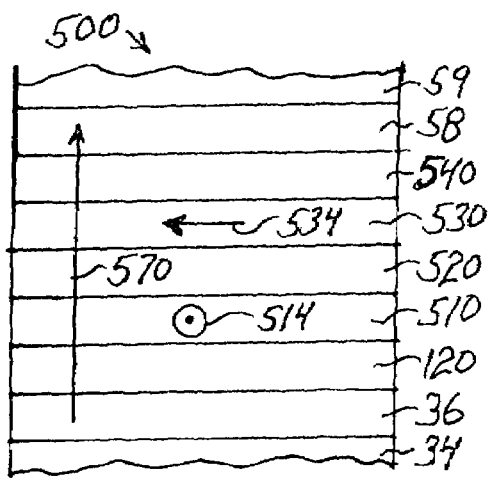
FIG. 16 is an ABS view depicting a further embodiment of a sensor structure of the present invention.

FIG. 16 depicts a further embodiment of a sensor 500 of the present invention. Specifically as depicted in FIG. 16, the sensor 500 includes a first magnetic shield layer 36, an antiferromagnetic layer 120 and a pinned magnetic layer structure 510 that is fabricated upon the AFM layer. The reference layer in the pinned magnetic layer structure 510 may be comprised of a laminated magnetic layer HL as is depicted in FIG. 15 and described hereinabove, and the magnetization of the ferromagnetic Heusler alloy layers within the HL structure is perpendicular to the ABS plane (see arrow 514), such as out of the plane of FIG. 16. A preferred pinned layer structure 510 includes the magnetic pinned layer, the AP spacer layer and the HL reference layer, as described above. Thereafter, a spacer layer 520 is fabricated upon the pinned magnetic layer 510, where the spacer layer is comprised of a nonmagnetic Heusler alloy, such as a material selected from the HNM group. Thereafter, a free magnetic layer 530 is fabricated upon the spacer layer 520. The free magnetic layer may be comprised of an HL layer as is depicted in FIG. 15 and described hereabove. The magnetization of the ferromagnetic Heusler alloy layers within the HL layer structure of the free magnetic layer is directed substantially within the ABS plane of the magnetic head (see arrow 534). An in-stack bias layer structure 540 comprised of a non-magnetic spacer layer and a magnetic in-stack biasing layer (not separately shown) may be fabricated upon the free magnetic layer 530. The magnetization of the in-stack bias layer is directed substantially parallel to the ABS and substantially antiparallel to the free layer may be added. The in-stack bias layer structure biases the magnetization 534 of the free layer via magneto-static coupling as is known to those skilled in the art. The magnetization of the in-stack bias layer is usually pinned by an AFM. Thereafter, the second magnetic shield 58 is fabricated upon the bias layer structure 540. The insulation layer 59 is next deposited upon the S2 shield 58 and the write head portion of the magnetic head is then fabricated, as has been described hereabove. In this configuration of a read head, the direction of the sense current (see arrow 570) is perpendicular to the plane (CPP) of the magnetic shield layers 36 and 58, and the magnetic shields are utilized as electrical leads for supplying current to the read sensor 40 which lies between them. In the embodiment 500 the laminated magnetic layer structure of the pinned magnetic layer 510 is formed with a thickness of from approximately 10 Å to approximately 100 Å, and preferably approximately 45 Å. The spacer layer 520 is formed with a thickness of from approximately 5 Å to approximately 50 Å and preferably approximately 25 Å, and the laminated magnetic layer structure of the free magnetic layer 530 is formed with a thickness of from approximately 10 Å to approximately 100 Å and preferably approximately 50 Å.

Figure 17:
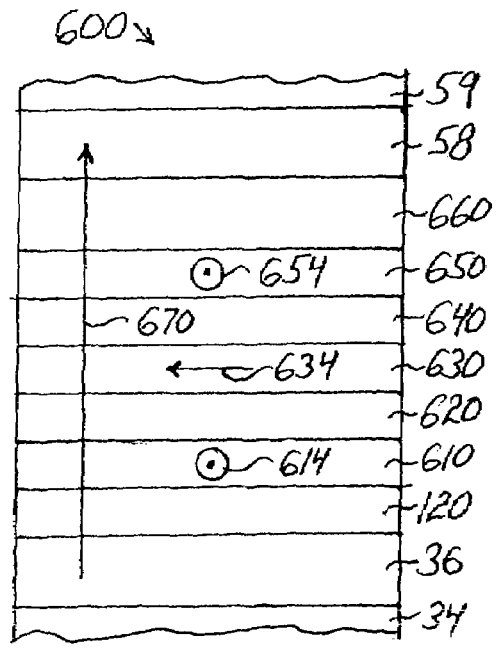
FIG. 17 is an ABS view depicting a yet another embodiment of a sensor structure of the present invention.

A further illustrative embodiment of a sensor 600 of the present invention is depicted in FIG. 17, which is an improved "dual" spin valve sensor. It is to be appreciated that the sensor 600 is similar in many respects to the sensor 300 depicted in FIG. 14. As depicted therein, the sensor 600 includes a first magnetic shield 36 that is fabricated upon an insulation layer 34. An antiferromagnetic (AFM) layer 120, typically comprised of a material such as IrMn, IrMnCr or PtMn is deposited upon the shield 36. Seedlayers may be used between S1 and the AFM layer to promote the correct crystal structure, as is known to those skilled in the art. Thereafter, a first pinned layer structure 610 is deposited upon the AFM layer 120. The pinned layer structure 610 may be comprised of a reference layer that is a laminated magnetic layer HL as is depicted in FIG. 15 and described hereinabove, and the magnetization of the ferromagnetic Heusler alloy layers within the HL structure is directed substantially perpendicular to the ABS plane (see arrow 614), such as into the plane of FIG. 17. A preferred first pinned layer 610 structure includes the magnetic pinned layer, the AP spacer layer and the HL reference layer, as described above. Thereafter, a spacer layer 620 is fabricated upon the pinned magnetic layer 610, where the spacer layer is comprised of a nonmagnetic Heusler alloy, such as a material selected from the HNM group. Thereafter, a free magnetic layer 630 is fabricated upon the spacer layer 620. The free magnetic layer may be comprised of an HL layer as is depicted in FIG. 15 and described hereabove. The magnetization of the ferromagnetic Heusler alloy layers within the HL layer structure of the free magnetic layer is directed substantially within the ABS plane of the magnetic head (see arrow 634). A second spacer layer 640 comprised of a nonmagnetic Heusler alloy, such as a material selected from the group HNM is then deposited upon the free magnetic layer 630. Thereafter a second pinned magnetic layer structure 650 is fabricated upon the second spacer layer 640. The second pinned layer structure 650 may be comprised of a reference layer that is a laminated magnetic layer HL as is depicted in FIG. 15 and described hereinabove, and the magnetization of the ferromagnetic Heusler alloy layers within the HL structure is directed substantially perpendicular to the ABS plane (see arrow 654), such as into the plane of FIG. 17. A preferred second pinned layer structure includes the HL reference layer, the AP spacer layer and the magnetic pinned layer, as described above. Thereafter, a second antiferromagnetic layer 660, typically comprised of a material such as PtMn, IrMn, or IrMnCr, is deposited upon the second pinned magnetic layer 650, such that the magnetization of the second pinned magnetic layer 650 is pinned substantially perpendicular to the ABS plane of the magnetic head (see arrow 654). Thereafter, a second magnetic shield 58 is fabricated upon the second AFM layer. The insulation layer 59 is next deposited upon the S2 shield 58 and the write head portion of the magnetic head is then fabricated, as has been described hereabove. In this configuration of a read head, the direction of the sense current (see arrow 670) is perpendicular to the plane (CPP) of the magnetic shield layers 36 and 58, and the magnetic shields are utilized as electrical leads for supplying current to the read sensor 40 which lies between them. In the embodiment 600 the laminated magnetic layer structure of the pinned magnetic layers 610 and 650 are formed with a thickness of from approximately 10 to approximately 100 Å, and preferably approximately 45 Å. The spacer layers 620 and 640 are formed with a thickness of from approximately 5 to approximately 50 Å and preferably approximately 25 Å, and the laminated magnetic layer structure of the free magnetic layer 630 is formed with a thickness of from approximately 10 to approximately 100 Å and preferably approximately 50 Å.

In practice, the Heusler layers may be laminated by magnetic layers to improve magnetic coupling with the antiferromagnet or AP spacer, or to improve magnetic properties such as coercivity and magnetostriction. An example of this is in US patent application US20040165320A1: "Magnetoresistive device with exchange-coupled structure having half-metallic ferromagnetic Heusler alloy in the pinned layer" by the inventors hereof. The magnetic layer can be an alloy principally comprised of Cobalt, Iron and Nickel, such as $Co_{90}Fe_{10}$. One embodiment of this might be for a Heusler pinned layer: Antiferromagnet/magnetic alloy/Heusler. A second embodiment would be for a Heusler as the reference layer, as in Antiferromagnet/magnetic alloy 1/AP spacer/magnetic alloy 2/Heusler. A third embodiment would be to laminate the free layer to control magnetostriction as in HNM/HFM/Magnetic Alloy/HFM/HNM, where the magnetic alloy is principally comprised of cobalt, iron, nickel or alloys thereof.

While the present invention has been shown and described with regard to certain preferred embodiments, it is to be understood that modifications in form and detail will no doubt be developed by those skilled in the art upon reviewing this disclosure. It is therefore intended that the following claims cover all such alterations and modifications that nevertheless include the true spirit and scope of the inventive features of the present invention.

We claim:

1. A magnetic head including a read sensor, comprising:
a reference magnetic layer
a free magnetic layer;
a spacer layer being disposed between said reference magnetic layer and said free magnetic layer;
wherein at least one of said free magnetic layer and said reference magnetic layer is comprised of a plurality of layers comprising at least two magnetic layers having a direction of magnetization that is in the same direction and that are comprised of $Co_2MnX$ where X is a material selected from the group consisting of Ge, Si, Al, Ga and Sn, and at least one nonmagnetic layer that is comprised of a material selected from the group consisting of $Ni_3Sn$, $Ni_3Sb$, $Ni_2LiGe$, $Ni_2LiSi$, $Ni_2CuSn$, $Ni_2CuSb$, $Cu_2NiSn$, $Cu_2NiSb$, $Cu_2LiGe$ and $Ag_2L$; and
wherein said spacer layer is comprised of a material selected from the group consisting of $Ni_3Sn$, $Ni_3Sb$, $Ni_2LiGe$, $Ni_2LiSi$, $Ni_2CuSn$, $Ni_2CuSb$, $Cu_2NiSn$, $Cu_2NiSb$, $Cu_2LiGe$ and $Ag_2LiSn$.

2. A magnetic head as described in claim 1 wherein said reference layer is part of a pinned magnetic layer structure that includes a pinned magnetic layer that is primarily composed of a material from the group consisting of Co, Ni, Fe and their alloys.

3. A magnetic head as described in claim 2 wherein said pinned magnetic layer structure further includes an AP spacer material layer that is primarily composed of a material from the group consisting of Ru, Cr, Ir, Rh, and their alloys, and is disposed between said pinned magnetic layer and said reference layer.

4. A magnetic head as described in claim 1 wherein said free magnetic layer and said reference layer are comprised of the same materials.

5. A magnetic head as described in claim 1 where said free layer is composed of a plurality of Heusler alloy and magnetic alloy layers, where said magnetic alloy is selected from the group consisting of Co, Fe, Ni and their alloys.

6. A magnetic head as described in claim 4 wherein said free magnetic layer is comprised of magnetic layers that are composed of $Co_2MnGe$ and said reference layer is comprised of magnetic layers that are composed of $Co_2MnGe$.

7. A magnetic head as described in claim 6 wherein said spacer layer is comprised of $Ni_3Sn$.

8. A magnetic layer structure comprising:
a plurality of magnetic layers and a plurality of nonmagnetic layers, wherein each said nonmagnetic layer is disposed between a said magnetic layer, and wherein each said magnetic layer is comprised of a ferromagnetic Heusler alloy, and wherein each said nonmagnetic layer is comprised of a nonmagnetic Heusler alloy; and
wherein a magnetization of each said magnetic layer is in the same direction.

9. A magnetic layer structure as described in claim 8 wherein each said magnetic layer is comprised of $Co_2MnX$ where X is a material selected from the group consisting of Ge, Si, Al, Ga and Sn.

10. A magnetic layer structure as described in claim 8 wherein each said nonmagnetic layer is comprised of a material selected from the group consisting of $Ni_3Sn$, $Ni_3Sb$, $Ni_2LiGe$, $Ni_2LiSi$, $Ni_2CuSn$, $Ni_2CuSb$, $Cu_2NiSn$, $Cu_2NiSb$, $Cu_2LiGe$ and $Ag_2LiSn$.

11. A magnetic layer structure as described in claim 8, wherein each said magnetic layer is formed with a thickness of from approximately 5 to approximately 50 Å.

12. A magnetic layer structure as described in claim 8 wherein each said nonmagnetic layer is formed with a thickness of from approximately 5 to approximately 50 Å.

13. A magnetic layer structure as described in claim 8 wherein two said nonmagnetic layers are included within said magnetic layer structure.

14. A magnetic layer structure as described in claim 8 wherein each said magnetic layer is formed with a thickness of approximately 10 Å, and each said nonmagnetic layer is formed with a thickness of approximately 10 Å.

15. A magnetic head as described in claim 8 wherein said reference layers are part of pinned magnetic layer structures that include a pinned magnetic layer that is primarily composed of a material from the group consisting of Go, Ni, Fe and their alloys.

16. A magnetic head as described in claim 15 wherein said pinned magnetic layer structures further include AP spacer materials that are primarily composed of a material from the group consisting of Ru, Cr, Ir, Rb, and their alloys.

17. A magnetic head as described in claim 8 wherein said ferromagnetic Heusler alloy is comprised of $Co_2MnX$ where X is a material selected from the group consisting of Ge, Si, Al, Ga and Sn.

18. A magnetic head as described in claim 8 wherein said nonmagnetic Heusler alloy is comprised of a material selected from the group consisting of $Ni_3Sn$, $Ni_3Sb$, $Ni_2LiGe$, $Ni_2LiSi$, $Ni_2CuSn$, $Ni_2CuSb$, $Cu_2NiSn$, $Cu_2NiSb$, $Cu_2LiGe$ and $Ag_2LiSn$.

19. A magnetic head as described in claim 8 wherein said sensor structure comprises a reference layer, a first spacer layer, a free magnetic layer, a second spacer layer and a second reference layer.

20. A magnetic head as described in claim 8 wherein said ferromagnetic Heusler alloy is comprised of $Co_2MnX$ where X is a material selected from the group consisting of Ge, Si, Al, Ga and Sn and wherein said nonmagnetic Heusler alloy is comprised of a material selected from the group consisting of $Ni_3Sn$. $Ni_3Sb$, $Ni_2LiGe$, $Ni_2LiSi$, $Ni_2CuSn$, $Ni_2CuSb$, $Cu_2NiSn$, $Cu_2NiSb$, $Cu_2LiGe$ and $Ag_2LiSn$.

21. A magnetic head as described in claim 8 wherein at least one said reference layer is comprised of a reference magnetic layer structure including a plurality of magnetic layers and a plurality of nonmagnetic layers, wherein each said nonmagnetic layer is disposed between a said magnetic layer, and wherein each said magnetic layer is comprised of a ferromagnetic Heusler alloy, and wherein each said nonmagnetic layer is comprised of a nonmagnetic Heusler alloy; and wherein a magnetization of each said magnetic layer of said magnetic reference layer structure is in the same direction.

22. A magnetic head as described in claim 8 wherein at least one said free magnetic layer is comprised of a magnetic layer structure including a plurality of magnetic layers and a plurality of nonmagnetic layers, wherein each said normagnetic layer is disposed between a said magnetic layer, and wherein each said magnetic layer is comprised of a ferromagnetic Heusler alloy, and wherein each said nonmagnetic layer is comprised of a nonmagnetic Heusler alloy; and wherein a magnetization of each said magnetic layer of said free magnetic layer structure is in the same direction.

23. A magnetic head including a read sensor, comprising:

at least one reference layer;

at least one free magnetic layer;

at least one spacer layer being disposed between each said reference layer and each said free magnetic layer;

wherein at least one of said free magnetic layers and said reference layers is comprised of a magnetic layer structure including a plurality of magnetic layers and a plurality of nonmagnetic layers, wherein each said nonmagnetic layer is disposed between a said magnetic layer, and wherein each said magnetic layer is comprised of a ferromagnetic Heusler alloy, and wherein each said nonmagnetic layer is comprised of a nonmagnetic Heusler alloy; and wherein a magnetization of each said ferromagnetic Heusler alloy layer of said magnetic layer structure is in the same direction.

\* \* \* \* \*